(12) United States Patent
Kawamura

(10) Patent No.: US 8,373,424 B2
(45) Date of Patent: Feb. 12, 2013

(54) APPARATUS FOR DETECTING FAULT OF FLYING CAPACITOR OF INSULATED CONDITION DETECTING UNIT

(75) Inventor: Yoshihiro Kawamura, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 13/330,510

(22) Filed: Dec. 19, 2011

(65) Prior Publication Data

US 2012/0153966 A1 Jun. 21, 2012

(30) Foreign Application Priority Data

Dec. 20, 2010 (JP) .............................. P2010-283573

(51) Int. Cl.
*G01R 31/02* (2006.01)
(52) U.S. Cl. .................... 324/548; 324/658; 324/503
(58) Field of Classification Search .................. 324/551, 324/557, 503, 548, 658, 691
See application file for complete search history.

(56) References Cited

U.S. PATENT DOCUMENTS

| 5,818,236 A * | 10/1998 | Sone et al. ..................... 324/509 |
| 2009/0289640 A1 | 11/2009 | Kawamura et al. |

FOREIGN PATENT DOCUMENTS

JP 2009-281986 12/2009

\* cited by examiner

*Primary Examiner* — Vincent Q Nguyen
(74) *Attorney, Agent, or Firm* — Finnegan, Henderson, Farabow, Garrett & Dunner, L.L.P.

(57) ABSTRACT

An apparatus for detecting a fault of a flying capacitor of an insulated condition detecting unit measures (step S1), at the start of discharge of the flying capacitor, a discharge voltage of the flying capacitor according to a charge voltage of a read capacitor. After a period from the start of discharge, the apparatus measures (step S3) a discharge voltage of the flying capacitor according to a charge voltage of the read capacitor. According to a difference between the measured discharge voltages, the apparatus obtains (step S5) a discharge amount of the flying capacitor, compares the discharge amount with a reference threshold, and diagnoses (step S7) an open fault of four capacitors that constitute the flying capacitor.

2 Claims, 5 Drawing Sheets

FIG. 6

Conditions: Appld = 100 V, RC = 1000 KΩ, t1 = 0.1 sec

| Condition of C1 | Settings | | | | | VD1 (V) | V0 (V) | Discharge measurement | | |
|---|---|---|---|---|---|---|---|---|---|---|
| | Appld (V) | RC (Ω) | C1 (F) | RD (Ω) | t1 (sec) | | | 50% discharge | | |
| | | | | | | | | VD2 | ΔVD | Ratio |
| Reference (4 normal) | 100 | 1000000 | 1.2E-07 | 100000 | 0.10 | 56.54 | 100.00 | 28.36 | -28.18 | -49.84% |
| 1 open | 100 | 1000000 | 9.0E-08 | 100000 | 0.10 | 67.08 | 118.64 | 26.73 | -40.35 | -60.15% |
| 2 open | 100 | 1000000 | 6.0E-08 | 100000 | 0.10 | 81.11 | 143.46 | 20.41 | -60.71 | -74.84% |
| 3 open | 100 | 1000000 | 3.0E-08 | 100000 | 0.10 | 96.43 | 170.56 | 6.10 | -90.33 | -93.67% |

US 8,373,424 B2

APPARATUS FOR DETECTING FAULT OF FLYING CAPACITOR OF INSULATED CONDITION DETECTING UNIT

BACKGROUND OF THE INVENTION

1. Field of the Invention

The present invention relates to a unit for detecting a ground fault or an insulated condition of an ungrounded power source with respect to a ground potential portion, and particularly, to an apparatus for detecting a fault of a flying capacitor used in such a unit.

2. Description of Related Art

A vehicle that uses electricity as driving energy usually employs a high-voltage (for example, 200 V) DC power source configured as an ungrounded power source insulated from a vehicle body. In order to detect a ground fault or an insulated condition of the ungrounded power source with respect to the vehicle body, i.e., a ground potential portion, a detecting unit employing a flying capacitor is used.

The detecting unit controls internal switches to charge the flying capacitor with a charge amount corresponding to a voltage of the DC power source insulated from the ground potential portion, a charge amount corresponding to a ground fault resistance on the positive terminal side of the DC power source, and a charge amount corresponding to a ground fault resistance on the negative terminal side of the DC power source, respectively. Thereafter, a controller of the detecting unit measures a charge voltage at each of the charge amounts, calculates the ground fault resistances on the positive and negative terminal sides of the DC power source, and detects a ground fault or an insulated condition of the DC power source.

In recent years, the flying capacitor is required to be made of a ceramics capacitor that is small and realizes large capacitance. The ceramics capacitor is known to greatly change the capacitance thereof depending on a DC bias. To eliminate the influence of a DC bias on the capacitance of a ceramics capacitor, Japanese Unexamined Patent Application Publication No. 2009-281986, for example, discloses a technique of configuring the detecting unit so that a charge voltage of the ceramics capacitor becomes equal to a charge voltage occurring at the charge amount corresponding to the voltage of the DC power source in a case where a ground fault resistance is at an alarming level.

SUMMARY OF THE INVENTION

The capacitance of the flying capacitor changes not only due to the above-mentioned DC bias but also due to ambient temperature or characteristic variations of the flying capacitors. There is a requirement to detect an insulated condition of a power source without regard to variations in the capacitance of the flying capacitor.

There is also a requirement to detect a fault of the flying capacitor that may change the capacitance of the flying capacitor by discriminating such a capacitance change caused by the fault from a capacitance change caused by the individual characteristic difference of the flying capacitor.

To increase capacitance, the flying capacitor is sometimes constituted with a plurality of ceramics capacitors that are connected in parallel with one another. In this case, some of the ceramics capacitors in the flying capacitor may cause a fault such as an open fault. Such a fault may cause a change in the capacitance of the flying capacitor and such a capacitance change is similar to a capacitance change caused by the individual characteristic variability of the flying capacitor. It is very useful if a fault of the flying capacitor is detected without confusing it with the capacitance change due to the individual characteristic variability of the flying capacitor.

The present invention provides an apparatus for detecting a fault of a flying capacitor in an insulated condition detecting unit that uses the flying capacitor to detect a ground fault or an insulated condition of an object, capable of detecting a fault of the flying capacitor that entails a capacitance change without confusing it with a capacitance change that may occur in the flying capacitor even when the flying capacitor is normally functioning.

According to a first aspect of the present invention, the apparatus for detecting a fault of a flying capacitor in an insulated condition detector that detects an insulated condition of a DC power source insulated from a ground potential portion according to a charge voltage of the flying capacitor charged with a charge amount corresponding to a voltage of the DC power source and a charge voltage of the flying capacitor charged through an insulation resistance measuring circuit including the DC power source and an insulation resistance of the DC power source. The apparatus for detecting a fault of a flying capacitor includes a charge voltage measuring unit that measures a peak charge voltage of the flying capacitor, a discharge voltage measuring unit that measures a discharge voltage of the flying capacitor a predetermined time after the start of discharge of the flying capacitor charged at the peak charge voltage, and a diagnosing unit that diagnoses a fault of the flying capacitor according to a discharge amount of the flying capacitor in a period from the start of discharge of the flying capacitor, the discharge amount being obtained from a difference between the peak charge voltage measured with the charge voltage measuring unit and the discharge voltage measured with the discharge voltage measuring unit.

BRIEF DESCRIPTION OF THE DRAWINGS

FIG. 6 is a table listing examples of thresholds usable to detect the fault state of FIG. 4B.

DESCRIPTION OF PREFERRED EMBODIMENTS

An embodiment of the present invention will be explained in detail with reference to the drawings.

Figure 1:
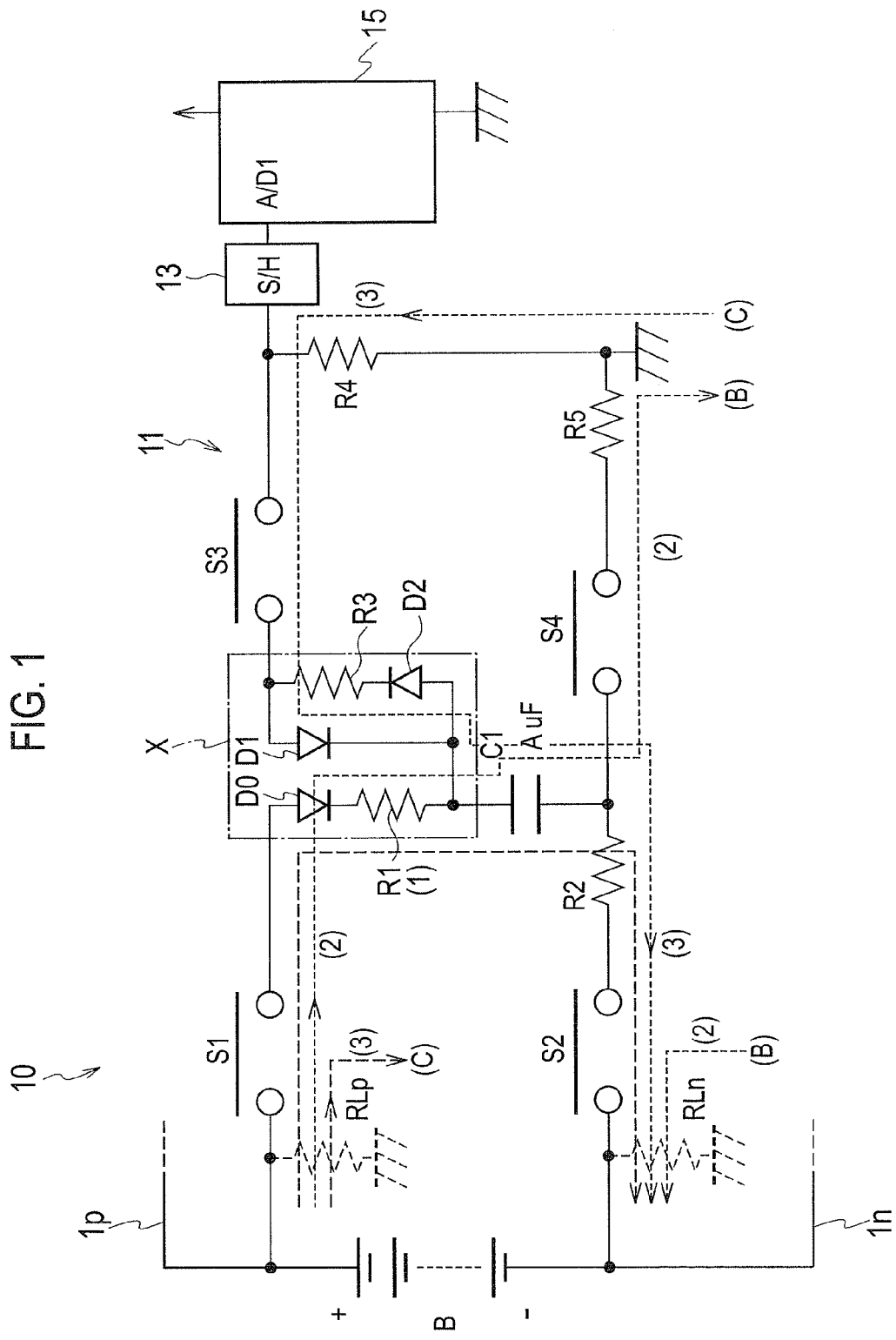
FIG. 1 is a circuit diagram illustrating an insulated condition detecting unit having an apparatus for detecting a fault of a flying capacitor according to an embodiment of the present invention.

FIG. 1 is a circuit diagram illustrating an insulated condition detecting unit having an apparatus for detecting a fault of a flying capacitor according to an embodiment of the present invention. The insulated condition detecting unit 10 detects a ground fault or an insulated condition of main circuit wiring 1p on the positive terminal side of a DC power source B that is insulated from a ground potential portion such as a vehicle body (not illustrated), or main circuit wiring 1n on the negative terminal side of the DC power source B.

In FIG. 1, "RLp" is a ground fault resistance on the positive terminal side and "RLn" is a ground fault resistance on the negative terminal side. These ground fault resistances RLp and RLn are imaginary resistances that may appear when the main circuit wiring 1p on the positive terminal side or the main circuit wiring 1n on the negative terminal side causes a ground fault.

The insulated condition detecting unit 10 for detecting a ground fault or an insulated condition of the main circuit wiring 1p or 1n includes a ground fault detector 11 including the flying capacitor C1, a sample and hold circuit (S/H) 13 that samples and holds a charge voltage and discharge voltage of the flying capacitor C1, and a microcomputer 15 such as a microcontroller that detects a value held in the sample and hold circuit 13 and measures a charge/discharge voltage of the flying capacitor C1. The flying capacitor C1 according to the embodiment is a ceramics capacitor.

In addition to the flying capacitor C1, the ground fault detector 11 includes switches S1 and S2 that selectively connect the flying capacitor C1 to the positive and negative electrodes of the DC power source B and switches S3 and S4 that selectively connect the flying capacitor C1 to the microcomputer 15 and ground potential portion. Between the flying capacitor C1 and the switch S1, a resistor R1 is connected in series. Between the flying capacitor C1 and the switch S2, a resistor R2 is connected in series.

When the microcomputer 15 measures a charge voltage or a discharge voltage of the flying capacitor C1, insulation of the DC power source B must be secured. For this, the resistors R1 and R2 have the same high resistance value.

Figure 2:
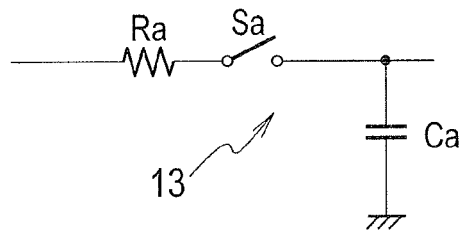
FIG. 2 is a circuit diagram illustrating a sample and hold circuit arranged in the insulated condition detecting unit of FIG. 1.

FIG. 2 is a circuit diagram illustrating the sample and hold circuit 13. The sample and hold circuit 13 includes a switch Sa having a first end connected to a first A/D conversion port A/D1 of the microcomputer 15, a read capacitor Ca connected between the first end of the switch Sa and the ground potential portion, and a resistor Ra connected in series between a second end of the switch Sa and the switch S3.

While the switch Sa is being closed, the read capacitor Ca is charged with potential appearing at the first end of the switch Sa through the resistor Ra.

The microcomputer 15 operates with a power source (not illustrated) whose voltage is lower than the voltage of the DC power source B, to isolate the DC power source B from the ground potential of the microcomputer 15. The switches S1 to S4 of the ground fault detector 11 and the switch Sa of the sample and hold circuit 13 are made of, for example, optical MOSFETs that are insulated from the DC power source B and are turned on/off from the microcomputer 15.

The first A/D conversion port A/D1 of the microcomputer 15 is connected through the sample and hold circuit 13 to the switch S3. A connection point of the sample and hold circuit 13 and switch S3 is grounded through a resistor R4. Between the switch S4 and the ground potential portion, a resistor R5 is connected. The switches S1 and S3 on the first end side (the upper electrode side in FIG. 1) of the flying capacitor C1 are connected in series. Between a connection point of the switches S1 and S3 and the first end of the flying capacitor C1, a switching circuit of current direction X is connected.

The switching circuit of current direction X is a parallel circuit including a series circuit that includes a diode D0 whose forward direction is oriented from the switch S1 toward the first end of the flying capacitor C1 and a resistor R1, a circuit that includes a diode D1 whose forward direction is oriented from the switch S3 toward the first end of the flying capacitor C1, and a series circuit that includes a diode D2 whose forward direction is oriented from the first end of the flying capacitor C1 toward the switch S3 and a resistor R3.

A sequence of detecting a ground fault or an insulated condition of the DC power source B carried out by the insulated condition detecting unit 10 will be explained. First, the microcomputer 15 turns on the switches S1 and S2 and off the switches S3, S4, and Sa for a predetermined time. The predetermined time is shorter than a time necessary for completely charging the flying capacitor C1.

This causes a charging current passing through a path extending along the positive electrode of the DC power source B, the main circuit wiring 1p on the positive terminal side, the switch S1, the diode D0, the resistor R1, the first end (the upper electrode in FIG. 1) of the flying capacitor C1, the second end (the lower electrode in FIG. 1) of the flying capacitor C1, the resistor R2, the switch S2, the main circuit wiring 1n on the negative terminal side, and the negative electrode of the DC power source B. This charging circuit is referred to as first charging circuit.

In the first charging circuit, the flying capacitor C1 is charged with a charge amount corresponding to the voltage of the DC power source B. Due to the charging, the first end of the flying capacitor C1 becomes a positive electrode and the second end thereof becomes a negative electrode.

Thereafter, the microcomputer 15 turns off the switches S1 and S2 and turns on the switches S3 and S4. This connects the positive electrode of the flying capacitor C1 through the diode D2, resistor R3, and switch S3 to the sample and hold circuit 13 and the negative electrode of the flying capacitor C1 through the switch S4 and resistor R5 to the ground potential portion. As a result, the flying capacitor C1 discharges.

Figure 3:
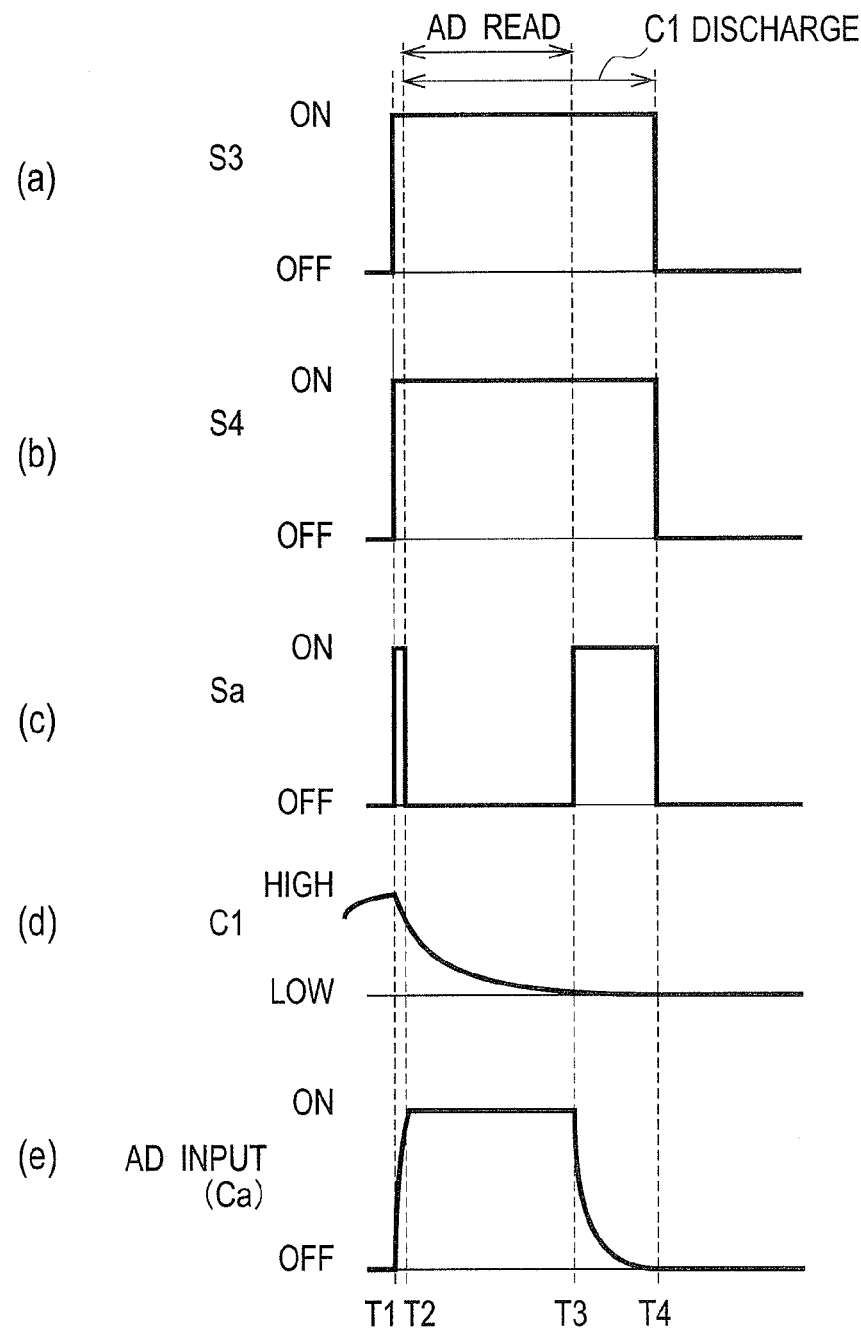
FIG. 3 is a time chart illustrating relationships between ON/OFF of switches of FIGS. 1 and 2 and charged states of capacitors.

As illustrated in the time chart of FIG. 3, the microcomputer 15 turns on the switches S3 and S4 at time T1, and at the same time, turns on the switch Sa of the sample and hold circuit 13 for a short time (an interval between T1 and T2, for example, 200 to 300 μs). As a result, the charge voltage of the flying capacitor C1 is divided by the resistors R3 and R4 and the read capacitor Ca is charged due to a driving force of a voltage across the resistor R3.

When the flying capacitor C1 starts to discharge, the flying capacitor C1 has the charge amount corresponding to the voltage of the DC power source B. Accordingly, when the read capacitor Ca is charged with a discharge voltage of the flying capacitor C1 just after the start of discharge of the flying capacitor C1, a charge amount of the read capacitor Ca is equal to the charge amount corresponding to the voltage of the DC power source B multiplied by a voltage dividing ratio of the resistors R4 and R5.

The microcomputer 15 turns off the switch Sa of the sample and hold circuit 13 at time T2 and the divided charge potential of the read capacitor Ca is transmitted from the sample and hold circuit 13 to the first A/D conversion port A/D1 of the microcomputer 15 and is measured. According to the measured value, the voltage dividing ratio of the resistors R3 and R4, and the voltage dividing ratio of the resistors R4 and R5, the microcomputer 15 calculates a charge voltage Vc1 of the flying capacitor C1 corresponding to the voltage of the DC power source B.

After the switch Sa of the sample and hold circuit 13 is turned off and while the charge voltage Vc1 of the flying capacitor C1 is being measured, the switches S3 and S4 are in an ON state, and therefore, the flying capacitor C1 continuously discharges.

When completing the measurement of the charge voltage Vc1 of the flying capacitor C1 at time T3, the microcomputer 15 turns on the switch Sa of the sample and hold circuit 13. This causes discharge of the flying capacitor C1 and read capacitor Ca. When these capacitors C1 and Ca are completely discharged at time T4, the microcomputer 15 turns off the switches S3, S4, and Sa.

After completely discharging the flying capacitor C1 and read capacitor Ca, the microcomputer 15 turns on the switches S1 and S4 and off the switches S2 and S3 for the above-mentioned predetermined time.

This causes a charging current passing through a path extending along the positive electrode of the DC power source B, the main circuit wiring 1p on the positive terminal side, the switch S1, the diode D0, the resistor R1, the first end of the flying capacitor C1, the second end of the flying capacitor C1, the switch S4, the resistor R5, the ground potential portion, the ground fault resistance RLn on the negative terminal side, the main circuit wiring 1n on the negative terminal side, and the negative electrode of the DC power source B. This charging circuit is referred to as second charging circuit.

In the second charging circuit, the flying capacitor C1 is charged with a charge amount corresponding to the ground fault resistance RLn on the negative terminal side. Due to this, the first end of the flying capacitor C1 becomes a positive electrode and the second end thereof becomes a negative electrode.

Thereafter, the microcomputer 15 turns off the switches S1 and S2 and turns on the switches S3 and S4 at T1 of FIG. 3. At the same time, the microcomputer 15 turns on the switch Sa of the sample and hold circuit 13 for a short time, e.g., an interval between T1 and T2 in FIG. 3 of 200 to 300 µs.

Until the microcomputer 15 again turns on the switch Sa of the sample and hold circuit 13, i.e., during an interval between T2 and T3 of FIG. 3, the microcomputer 15 measures a charge voltage Vc1− of the flying capacitor C1 corresponding to the ground fault resistance RLn on the negative terminal side, like measuring the charge voltage Vc1 of the flying capacitor C1 corresponding to the voltage of the DC power source B.

Thereafter, the microcomputer 15 completely discharges the flying capacitor C1 and read capacitor Ca, turns on the switches S2 and S3, and turns off the switches S1 and S4 for the above-mentioned predetermined time.

This causes a charging current passing through a path extending along the positive electrode of the DC power source B, the main circuit wiring 1p on the positive terminal side, the ground fault resistance RLp on the positive terminal side, the ground potential portion, the resistor R4, the switch S3, the diode D1, the first end of the flying capacitor C1, the second end of the flying capacitor C1, the resistor R2, the switch S2, the main circuit wiring 1n on the negative terminal side, and the negative electrode of the DC power source B. This charging circuit is referred to as third charging circuit.

In the third charging circuit, the flying capacitor C1 is charged with a charge amount corresponding to the ground fault resistance RLp on the positive terminal side. This makes the first end of the flying capacitor C1 positive and the second end thereof negative.

Thereafter, the microcomputer 15 turns off the switches S1 and S2 and turns on the switches S3 and S4 at time T1 in FIG. 3. At the same time, the microcomputer 15 turns on the switch Sa of the sample and hold circuit 13 for a short time, e.g., an interval between T1 and T2 in FIG. 3 of 200 to 300 µs.

Until the microcomputer 15 again turns on the switch Sa of the sample and hold circuit 13, i.e., during an interval between T2 and T3 of FIG. 3, the microcomputer 15 measures a charge voltage Vc1+ of the flying capacitor C1 corresponding to the ground fault resistance RLp on the positive terminal side, like measuring the charge voltage Vc1 of the flying capacitor C1 corresponding to the voltage of the DC power source B and like measuring the charge voltage Vc1− of the flying capacitor C1 corresponding to the ground fault resistance RLn on the negative terminal side. Thereafter, the flying capacitor C1 and read capacitor Ca are completely discharged.

The charge voltage Vc1 of the flying capacitor C1 corresponding to the voltage of the DC power source B, the charge voltage Vc1− of the flying capacitor C1 corresponding to the ground fault resistance RLn on the negative terminal side, the charge voltage Vc1+ of the flying capacitor C1 corresponding to the ground fault resistance RLp on the positive terminal side can be related to a parallel resultant resistance value R of the ground fault resistance RLp on the positive terminal side and ground fault resistance RLn on the negative terminal side. Namely, the resultant resistance R can be expressed as a function of $[\{(Vc1+)+(Vc1-)\}/Vc1]$.

According to this relationship, the microcomputer 15 calculates the parallel resultant resistance value of the ground fault resistances RLp and RLn on the positive and negative terminal sides, to detect a ground fault or an insulated condition of the DC power source B.

The ceramics capacitor used as the flying capacitor C1 in the ground fault detector 11 according to the embodiment greatly changes its capacitance depending on a DC bias. The capacitance of the flying capacitor C1 also varies depending on ambient temperature and an individual characteristic difference of the ceramics capacitor serving as the flying capacitor C1.

To eliminate the influence of such variations in the capacitance of the flying capacitor C1, the sequence of measuring the charge voltages Vc1, Vc1−, and Vc1+ carried out by the microcomputer 15 may be changed. This will be explained.

If the capacitance of the flying capacitor C1 decreases smaller than that in a normal state, a charge amount achieved by charging the flying capacitor C1 for a certain period increases larger than that in the normal state. As a result, a discharge amount of the flying capacitor C1 becomes larger for a certain interval from the start of discharge.

If the capacitance of the flying capacitor C1 increases larger than that in the normal state, a charge amount achieved by charging the flying capacitor C1 for a certain period decreases smaller than that in the normal state. As a result, a discharge amount of the flying capacitor C1 becomes smaller for a certain interval from the start of discharge.

When a certain time elapses after the start of discharge, the discharge of the flying capacitor C1 approaches saturation, and therefore, a discharge amount of the flying capacitor C1 after the saturation is nearly equalized without regard to whether the capacitance of the flying capacitor C1 is larger or smaller than that in the normal state.

This means that, although the charge amount of the flying capacitor C1 widely varies depending on variations in the capacitance characteristics of the flying capacitor C1, variations in the discharge voltage of the flying capacitor C1 become smaller a certain time after the start of discharge. More precisely, a discharge voltage VD1 at the start of discharge after charging the flying capacitor C1 for a predetermined time t1 and a discharge voltage VD2 after a period t2 from the start of discharge of the flying capacitor C1 satisfy the following relationship:

$$V_{D1} = V_0\left[1 - \exp\left\{-\left(\frac{t_1}{C_1 a R_C}\right)\right\}\right]$$

$$V_{D2} = V_0 \exp\left\{-\left(\frac{t_2}{C_1 a R_D}\right)\right\},$$

where V0 is a charge voltage of the flying capacitor C1, C1 is the capacitance of the flying capacitor C1, RC is a charging resistance value, RD is a discharge resistance value, and a is a variation coefficient of the capacitance of the flying capacitor C1 (i.e. a ratio with respect to the capacitance in the normal state).

It is apparent in the above relationships, as the capacitance of the flying capacitor C1 tends to decrease, the discharge voltage VD1 at the start of discharge increases and the discharge voltage VD2 after the period t2 from the start of discharge increases as well. On the other hand, as the capacitance of the flying capacitor C1 tends to increase, the discharge voltages VD1 and VD2 decreases.

It is understood that an increase or a decrease in the charge amount of the flying capacitor C1 with respect to the charge amount of the flying capacitor C1 in the normal state is canceled by an increase or a decrease in the discharge amount of the flying capacitor C1 that occurs for a certain period after the start of discharge.

In other words, there will be two ways to find a charge voltage V0 of the flying capacitor C1 after charging the flying capacitor C1 for the predetermined time t1 according to a discharge voltage of the flying capacitor C1 as follows:

(i) Finding the Charge Voltage V0 with the Use of the Discharge Voltage VD2

$$V0 = VD2 / \{(\text{discharge ratio based on } t2 \text{ and } C1 \times RD) \times (\text{charging ratio based on } t1 \text{ and } C1 \times RC)\} \quad (1);$$

(ii) Finding the Charge Voltage V0 with the Use of the Discharge Voltage VD1

$$V0 = VD1 / (\text{charging ratio based on } t1 \text{ and } C1 \times RC) \quad (2),$$

where "discharge ratio" is a charge residual ratio after discharging and "charging ratio" is a charge residual ratio after charging.

As mentioned above, finding the charge voltage V0 with the use of the discharge voltage VD2 according to the expression (1) is more precise than finding the charge voltage V0 with the use of the discharge voltage VD1 according to the expression (2).

Accordingly, after a certain time from the start of discharge of the flying capacitor C1, the microcomputer 15 turns off the switches S1 and S2 and turns on the switches S3, S4, and Sa (at time T1 in FIG. 3). Shortly thereafter, the microcomputer 15 turns off the switch Sa. During this short period (from T1 to T2 in FIG. 3), the read capacitor Ca is charged and a potential obtained by dividing a charge voltage of the read capacitor Ca at this time is measured through the first A/D conversion port A/D1 of the microcomputer 15. According to the measured potential, the microcomputer 15 calculates the charge voltage of the flying capacitor C1.

In this way, the charge voltages Vc1, Vc1−, and Vc1+ of the flying capacitor C1 may be obtained from the discharge voltage VD2 that is measured a certain time (t2) after the start of discharge of the flying capacitor C1. Alternatively, the charge voltage Vc1 of the flying capacitor C1 charged with the charge amount corresponding to the voltage of the DC power source B may be obtained from the discharge voltage VD2 and the charge voltage Vc1− of the flying capacitor C1 corresponding to the ground fault resistance RLn on the negative terminal side and the charge voltage Vc1+ of the flying capacitor C1 corresponding to the ground fault resistance RLp on the positive terminal side may be obtained from the discharge voltage VD1 measured at the start of discharge.

A time point when the discharge of the flying capacitor C1 saturates differs depending on the capacitance of the flying capacitor C1. Accordingly, a time point when a discharge amount of the flying capacitor C1 whose capacitance is abnormal becomes substantially equal to that of the flying capacitor C1 whose capacitance is normal, i.e., the certain period (t2) after the start of discharge differs depending on whether the abnormal capacitance is larger or smaller than the normal capacitance.

To deal with this, a period from the start of discharge in which a discharge amount of the flying capacitor C1 whose capacitance is larger than normal becomes substantially equal to that of the normal flying capacitor C1 and a period from the start of discharge in which a discharge amount of the flying capacitor C1 whose capacitance is smaller than normal becomes substantially equal to that of the normal flying capacitor C1 are measured and averaged. The average period may be used to calculate the discharge voltage VD2.

Figure 4A:
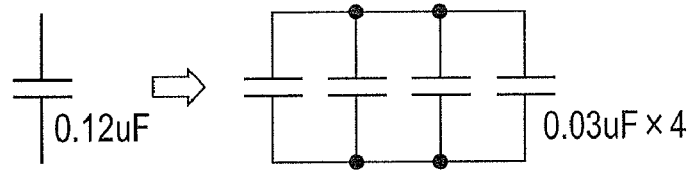
FIG. 4A illustrates an example of the flying capacitor of FIG. 1.
Figure 4B:
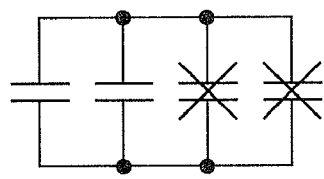
FIG. 4B illustrates an example of a fault state of the flying capacitor of FIG. 4A.

The flying capacitor C1 usually has a plurality of capacitors. FIG. 4A illustrates an example of the flying capacitor C1 configured by four capacitors that are connected in parallel with one another. In FIG. 4A, the flying capacitor C1 has a capacitance of 0.12 µF, and therefore, the four capacitors that form the flying capacitor C1 have each a capacitance of 0.03 µF. In FIG. 4B, two of the capacitors of the flying capacitor C1 have an open fault.

In this case, the other capacitors of the flying capacitor C1 are sound, and therefore, the flying capacitor C1 as a whole will not cause an open fault but only the capacitance of the flying capacitor C1 decreases smaller than the normal capacitance of the flying capacitor C1. If the discharge voltage VD2 of the flying capacitor C1 is used to find the charge voltage Vc1 (Vc1−, Vc1+) of the flying capacitor C1, the influence of the open fault of some capacitors in the flying capacitor C1 is negated. Accordingly, the charge voltage Vc1 (Vc1−, Vc1+) is unusable to detect the open fault of some capacitors of the flying capacitor C1.

To correctly detect an open fault occurring on some capacitors of the flying capacitor C1, the above-mentioned fact that, if the capacitance of the flying capacitor C1 is smaller than the normal value, a discharge amount of the flying capacitor C1 becomes larger for a certain period (for example, t2) from the start of discharge is usable.

Figure 5:
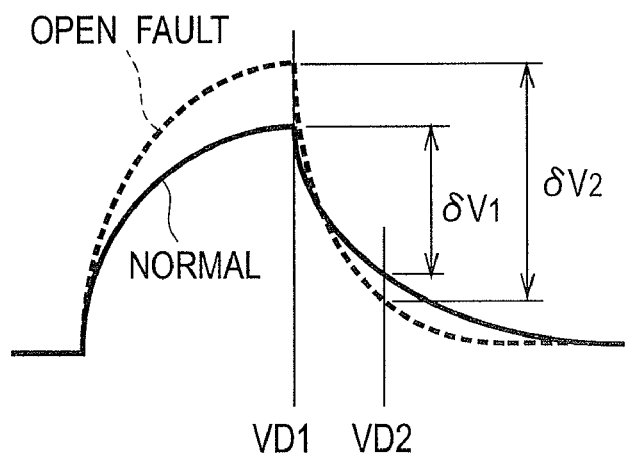
FIG. 5 illustrates the timing of measuring charge and discharge voltages to detect the fault state of FIG. 4B.

As illustrated in FIG. 5, a difference between the discharge voltage VD1 at the start of discharge and the discharge voltage VD2 after the period t2 from the discharge start is used by the microcomputer 15 to find a discharge amount (discharge ratio) during the period t2. Based on the discharge amount (discharge ratio), the microcomputer 15 diagnoses if some capacitor in the flying capacitor C1 has an open fault. In FIG. 5, δV1 is the normal discharge amount and δV2 is a discharge amount with an open fault.

FIG. 6 is a table listing sample values that are used to determine thresholds for discharge amount and diagnose a fault of the flying capacitor C1. In FIG. 6, a left part shows values obtained when the flying capacitor C1 is charged under the conditions of charge voltage (applied voltage) V0=100 V, charging resistance value $R_C$=1000 kΩ, and charging time t1=0.1 sec.

In the left part of FIG. 6, $R_C$ is a charging resistance value of the flying capacitor C1, C1 is the capacitance of the flying capacitor C1, $R_D$ is a discharge resistance value of the flying capacitor C1, and V0 is a charge voltage calculated according to the expression (1).

If the four capacitors of the flying capacitor C1 are all normal (Reference (4 normal) in FIG. 6), the flying capacitor C1 has a capacitance C1 of 1.2E-07 (F), a discharge voltage VD1 of 56.54 (V), and a charge voltage V0 of 100 (V) obtained from the expression (1).

If one (two, three) of the four capacitors of the flying capacitor C1 has an open fault (1 open (2 open, 3 open) in FIG. 6), the flying capacitor C1 has a capacitance C1 of 9.0E-08 (F) (6.0E-08 (F), 3.0E-08 (F)), a discharge voltage VD1 of 67.08 (V) (81.11 (V), 96.43 (V)), and a charge voltage V0 of 118.64 (V) (143.46 (V), 170.56 (V)) obtained from the expression (1).

In this way, the open fault of the flying capacitor C1 makes the charge voltage V0 calculated according to the expression (1) higher. Accordingly, to find the open fault, the calculated charge voltage must be compared with the applied source voltage.

As mentioned above, the charge voltage V0 obtained from the discharge voltage VD1 according to the expression (1) reflects a decrease in the capacitance of the flying capacitor C1. It is noted that, to eliminate the influence of the individual characteristic difference of the flying capacitor C1, the charge voltage V0 may be calculated from the discharge voltage VD2 according to the expression (2). This, however, provides a value that is very close to 100 (V), and therefore, is unusable to detect an open fault of one (two, three) of the four capacitors of the flying capacitor C1.

Values listed in a right part of FIG. 6 include a discharge amount (discharge ratio) of the flying capacitor C1 calculated according to a difference ΔVD between the discharge voltage VD1 measured at the start of discharge of the flying capacitor C1 and the discharge voltage VD2 measured after a period t2 from the discharge start. The period t2 corresponds to a discharge amount of 50%.

After the period t2 in which the flying capacitor C1 discharges to 50% with respect to the initial charge, the flying capacitor C1 has a discharge voltage VD2 of 28.36 (V) if the four capacitors are sound, 26.73 (V) if one of the four capacitor has an open fault, 20.41 (V) if two of the four capacitors have an open fault, and 6.10 (V) if three of the four capacitors have an open fault.

At this time, the difference ΔVD between VD1 and VD2 is −28.18 (V) if the four capacitors are sound, −40.35 (V) if one capacitor has an open fault, −60.71 (V) if two capacitors have an open fault, and −90.33 (V) if three capacitors have an open fault. These values correspond to discharge ratios of −49.84 (%), −60.15(%), −74.84(%), and −93.67(%), respectively. The mark "−" of each value indicates a decrease.

When the flying capacitor C1 without fault carries out 50% discharge, the flying capacitor C1 with one (two, three) of the four capacitors having a fault carries out 60% discharge or over.

In a case where the 50% discharge is measured, i.e., when the discharge voltage VD1 decreases to the discharge voltage VD2 after the period t2, a discharge ratio of the flying capacitor C1 is calculated. If the calculated discharge ratio is over 55%, the microcomputer 15 determines that any one of the four capacitors of the flying capacitor C1 has a fault.

In connection with the discharge amount (discharge ratio) of the flying capacitor C1 obtained from the difference ΔVD between VD1 and VD2, thresholds such as the above-mentioned 55% may be set between −60.15(%) and −74.84(%) and between −74.84(%) and −93.67(%). With the use of these thresholds, the microcomputer 15 is able to detect the number of capacitors having an open fault among the four capacitors of the flying capacitor C1.

The fault detection (diagnosis) mentioned above is carried out by the microcomputer 15 according to a fault diagnosis program stored in a ROM (not illustrated). This will be explained with reference to the flowchart of FIG. 7. This program may be carried out whenever the charge voltages Vc1, Vc1−, and Vc1+ of the flying capacitor C1 are obtained, or when some of these charge voltages are obtained.

In step S1, the microcomputer 15 measures a discharge voltage VD1 (corresponding to "a peak charge voltage of the flying capacitor" stipulated in the claims) of the flying capacitor C1 at the start of discharge of the flying capacitor C1 according to a charge voltage of the read capacitor Ca.

In step S3, the microcomputer 15 measures a discharge voltage VD2 (corresponding to "a discharge voltage of the flying capacitor" stipulated in the claims) of the flying capacitor C1 according to a charge voltage of the read capacitor Ca after the period t2 from the discharge start.

In step S5, the microcomputer 15 calculates a discharge amount (discharge ratio) of the flying capacitor C1 according to a difference ΔVD between the discharge voltage VD1 measured in step S1 and the discharge voltage VD2 measured in step S3. In step S7, the microcomputer 15 compares the calculated discharge amount (discharge ratio) with thresholds and diagnoses if the four capacitors of the flying capacitor C1 have an open fault, and if necessary, finds out the number of faulty capacitors.

This completes the detection process. A result of the detection may be used to display an alarm or control the operation of the insulated condition detecting unit 10.

Figure 7:
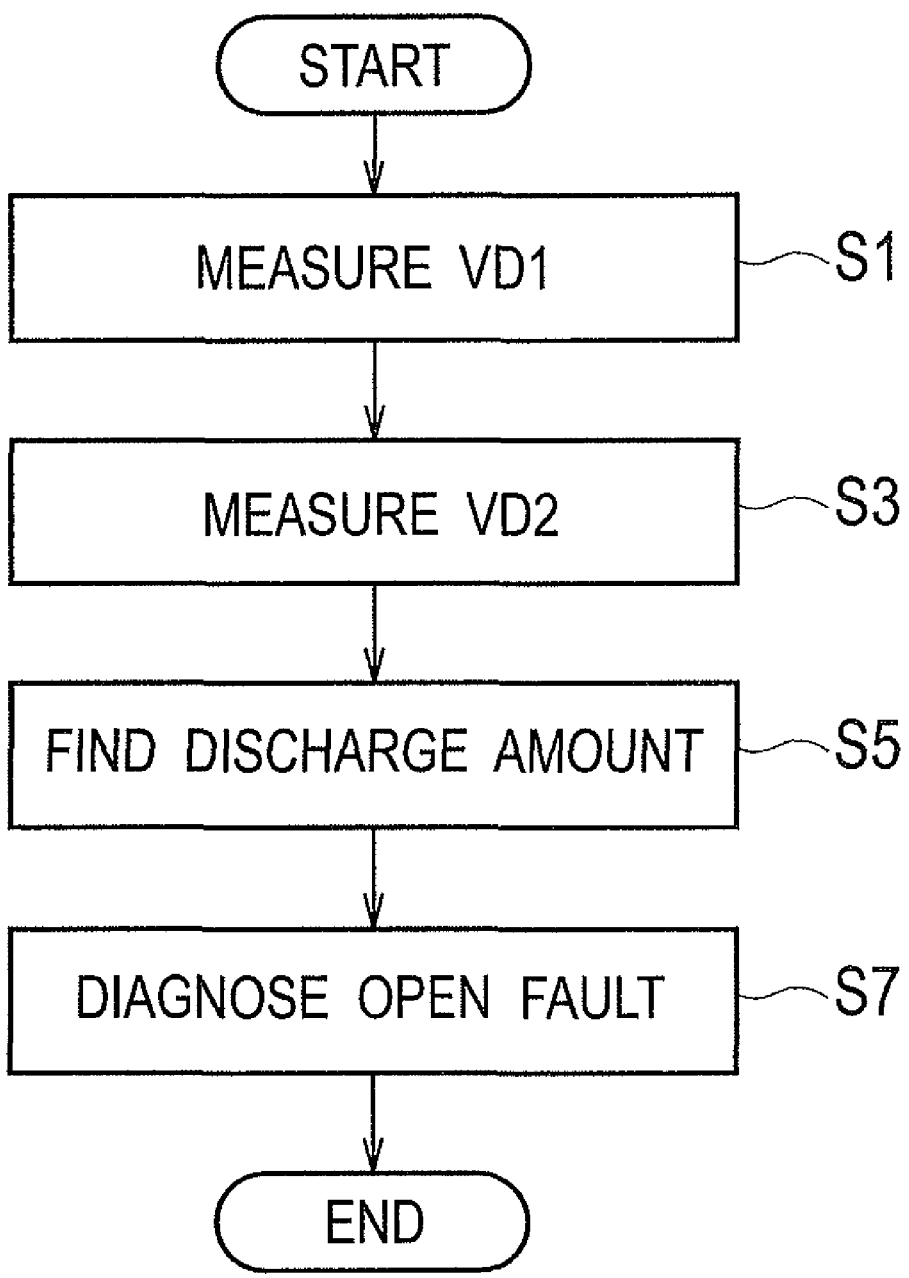
FIG. 7 is a flowchart illustrating a fault diagnosing process carried out by a microcomputer arranged in the detecting unit of FIG. 1 according to a program stored in a ROM.

According to the present embodiment, step S1 in the flowchart of FIG. 7 executed by the microcomputer 15 and the components of the ground fault detector 11 and sample and hold circuit 13 related to the execution of step S1 are represented by the "charge voltage measuring unit" as stipulated in the claims.

Step S3 of FIG. 7 executed by the microcomputer 15 and the components of the ground fault circuit 11 and sample and hold circuit 13 related to the execution of step S3 are represented by the "discharge voltage measuring unit" as stipulated in the claims.

Steps S5 and S7 in FIG. 7 executed by the microcomputer 15 and the components of the ground fault detector 11 and sample and hold circuit 13 related to the execution of steps S5 and S7 are represented by the "diagnosing unit" as stipulated in the claims.

Even in a case where a charge voltage V0 of the flying capacitor C1 is evaluated by using the discharge voltage VD2 measured after the period t2 from the start of discharge of the flying capacitor C1 in order to eliminate the influence of the characteristic variation of the flying capacitor C1, any open fault of the four capacitors of the flying capacitor C1 can be detected by the insulated condition detecting unit 10 according to the present embodiment.

The present embodiment finds a charge voltage V0 of the flying capacitor C1 by measuring a discharge voltage VD1 at the start of discharge of the flying capacitor C1 and a discharge voltage VD2 after the period t2 from the discharge start. These measured display voltages VD1 and VD2 are also applied to find a discharge amount (discharge ratio) in order to detect any fault in the flying capacitor C1 according to the present embodiment.

Instead of measuring the discharge voltages VD1 and VD2 to find a charge voltage V0 of the flying capacitor C1, a peak voltage of charging the flying capacitor C1 (corresponding to the discharge voltage VD1) and a discharge voltage (corresponding to the discharge voltage VD2) at a time after the start of discharge of the flying capacitor C1 by a predetermined time (e.g. t2) may be measured in order to find a discharge amount (discharge ratio) in the predetermined time (t2) from the start of discharge of the flying capacitor C1.

According to the present embodiment, the insulated condition detecting unit 10 uses the discharge voltage VD2 that is measured when the period t2 elapses after the start of discharge of the flying capacitor C1, to find a charge voltage V0 (an applied voltage to charge the flying capacitor C1) of the flying capacitor C1 without the influence of the individual characteristic difference of the flying capacitor C1.

The present invention is also applicable to an insulated condition detecting unit that finds a charge voltage (i.e. an applied voltage to charge the flying capacitor C1) of the flying capacitor C1 according to the above-mentioned resultant resistance R obtained as a function of [{(Vc1+)+(Vc1−)}/Vc1], or according to the expression (1).

When a flying capacitor causes an open fault, the capacitance of the flying capacitor decreases smaller than of normal. As a result, a charge amount of the flying capacitor increases larger than of normal, and therefore, a discharge amount of the charged flying capacitor in a certain period after the start of discharge increases larger than that when the flying capacitor is normal.

Based on these facts, the charge voltage measuring unit and discharge voltage measuring unit measure a charge voltage and a discharge voltage. According to a difference between the charge and discharge voltages, the fault detecting apparatus according to the present embodiment calculates a discharge amount in a predetermined period from the start of discharge of the flying capacitor. In a case where the apparatus compares the calculated discharge amount with a reference discharge amount of the flying capacitor without fault. And if the calculated discharge amount is apparently larger than the reference discharge amount, the apparatus determines that the flying capacitor has an open fault.

When the flying capacitor has a plurality of capacitors that are connected in parallel with one another, several reference values are set according to the number of the capacitors and are compared with the calculated discharge amounts, to determine the kind of a fault occurring in the flying capacitor.

Measured values of the insulated condition detector for detecting the insulated condition of the DC power source by way of a detection of the charging voltage of the flying capacitor is also applicable to a diagnosis of the flying capacitor according to the present invention, and thereby, to minimize the number of parts to be newly installed for diagnosing a fault of the flying capacitor and simplify the overall structure of the insulated condition detecting unit.

As mentioned above, the apparatus for detecting a fault of a flying capacitor in an insulated condition detecting unit according to the present invention is capable of detecting a fault of the flying capacitor by discriminating a change in the capacitance of the flying capacitor caused by the fault from a change in the capacitance of the flying capacitor that may normally occur due to, for example, an individual characteristic difference of the flying capacitor. The flying capacitor in the insulated condition detecting unit is used to detect a ground fault or an insulated condition of an ungrounded power source.

This application claims benefit of priority under 35 USC §119 to Japanese Patent Application No. 2010-283573, filed on Dec. 20, 2010, the entire content of which is incorporated by reference herein. The scope of the invention is defined with reference to the following claims.

What is claimed is:

1. An apparatus for detecting a fault of a flying capacitor of an insulated condition detecting unit that detects an insulated condition of a DC power source being insulated from a ground potential portion according to (i) a charge voltage of the flying capacitor charged with a charge amount corresponding to a voltage of the DC power source and (ii) a charge voltage of the flying capacitor charged through an insulation resistance measuring circuit including an insulation resistance of the DC power source, the apparatus comprising:
   a charge voltage measuring unit configured to measure a peak charge voltage of the flying capacitor;
   a discharge voltage measuring unit configured to measure a discharge voltage of the flying capacitor a predetermined time after the start of discharge of the flying capacitor, the flying capacitor being charged at the peak charge voltage measured with the charge voltage measuring unit; and
   a diagnosing unit configured to diagnose a fault of the flying capacitor according to a discharge amount of the flying capacitor in a period from the start of discharge of the flying capacitor, the discharge amount being obtained from a difference between the peak charge voltage measured with the charge voltage measuring unit and the discharge voltage measured with the discharge voltage measuring unit.

2. The apparatus of claim 1, wherein the charge voltage of the flying capacitor charged with the charge amount corresponding to the voltage of the DC power source is obtained according to a discharge voltage measured with the discharge voltage measuring unit.

* * * * *